US010426027B2

(12) United States Patent
Hanao et al.

(10) Patent No.: US 10,426,027 B2
(45) Date of Patent: Sep. 24, 2019

(54) CERAMIC MULTILAYER SUBSTRATE

(71) Applicant: Murata Manufacturing Co., Ltd., Nagaokakyo-shi, Kyoto-fu (JP)

(72) Inventors: Masaaki Hanao, Nagaokakyo (JP); Tsuyoshi Katsube, Nagaokakyo (JP); Kazuo Kishida, Nagaokakyo (JP)

(73) Assignee: MURATA MANUFACTURING CO., LTD., Nagaokakyo-shi, Kyoto-Fu (JP)

(*) Notice: Subject to any disclaimer, the term of this patent is extended or adjusted under 35 U.S.C. 154(b) by 0 days.

(21) Appl. No.: 15/918,253

(22) Filed: Mar. 12, 2018

(65) Prior Publication Data

US 2018/0206337 A1 Jul. 19, 2018

Related U.S. Application Data

(63) Continuation of application No. PCT/JP2016/077125, filed on Sep. 14, 2016.

(30) Foreign Application Priority Data

Sep. 18, 2015 (JP) ................................ 2015-185637

(51) Int. Cl.
*H05K 1/03* (2006.01)
*H05K 1/11* (2006.01)
(Continued)

(52) U.S. Cl.
CPC ........... *H05K 1/0306* (2013.01); *H05K 1/115* (2013.01); *H05K 3/0014* (2013.01);
(Continued)

(58) Field of Classification Search
CPC .... H05K 1/0306; H05K 1/115; H05K 3/4629; H05K 2201/0175; H05K 2201/0195; H05K 2203/1131
(Continued)

(56) References Cited

U.S. PATENT DOCUMENTS 5,464,950 A * 11/1995 Horiuchi ............. H01L 21/4857 174/250
6,588,097 B2 7/2003 Nishide et al.
(Continued)

FOREIGN PATENT DOCUMENTS

CN 1356288 A 7/2002
JP 2002-94244 A 3/2002
(Continued)

OTHER PUBLICATIONS

International Search Report issued in International Application No. PCT/JP2016/077125, dated Dec. 6, 2016.
(Continued)

*Primary Examiner* — Steven T Sawyer
(74) *Attorney, Agent, or Firm* — Arent Fox LLP

(57) ABSTRACT

A ceramic multilayer substrate that includes a ceramic insulator layer, which includes a first layer, a second layer, and a third layer and in which the first layer is interposed between the second layer and the third layer, an inner pattern conductor, an outer pattern conductor, and outer electrodes. The ceramic insulator layer is interposed between the inner pattern conductor and the outer pattern conductor. The sintering shrinkage start temperatures of the second layer alone and the third layer alone in a green sheet state are higher than or equal to the sintering shrinkage stop temperature of the first layer alone in a green sheet state. The thickness of the ceramic insulator layer is 5.0 μm to 55.7 μm. The ratio of the total of the thickness of the second layer and the thickness of the third layer to the thickness of the first layer is 0.25 to 1.11.

12 Claims, 10 Drawing Sheets

100B 7A 5 4A 7B 3 1 3 1 2 CL 1 2 6A 4B 6B 7C

100C 7A 5 4A 4B 7B 3 1 2 CL 3 1 2 CL 3 1 2 CL 6A 4C 4D 6B 7C

(51) Int. Cl.
*H05K 3/00* (2006.01)
*H05K 3/40* (2006.01)
*H05K 3/46* (2006.01)
*G01R 31/28* (2006.01)

(52) U.S. Cl.
CPC ......... *H05K 3/4038* (2013.01); *H05K 3/4629* (2013.01); *H05K 3/4644* (2013.01); *G01R 31/2801* (2013.01); *H05K 2201/0175* (2013.01); *H05K 2201/0191* (2013.01); *H05K 2201/0195* (2013.01); *H05K 2203/1131* (2013.01)

(58) Field of Classification Search
USPC .................................................. 174/262, 264
See application file for complete search history.

(56) References Cited

U.S. PATENT DOCUMENTS

2002/0061629 A1 5/2002 Nishide et al.
2002/0098330 A1 7/2002 Masuko
2007/0205692 A1* 9/2007 Nakao ................ H01L 21/4807 310/311
2008/0156413 A1* 7/2008 Nomiya ................ H05K 1/092 156/89.12
2008/0261005 A1* 10/2008 Nomiya .............. H01L 21/4803 428/210
2010/0006335 A1* 1/2010 Nomiya ................... H05K 3/38 174/262
2011/0284270 A1* 11/2011 Katsube .................. B32B 18/00 174/251
2014/0305685 A1* 10/2014 Futamata ............... H05K 1/167 174/257
2016/0088729 A1* 3/2016 Kobuke ............... H05K 3/4629 174/251

FOREIGN PATENT DOCUMENTS

JP 2002-368421 A 12/2002
JP 2006-181737 A 7/2006
JP 2008-85034 A 4/2008
JP 2008-270741 A 11/2008
JP 2010-199345 A 9/2010

OTHER PUBLICATIONS

Written Opinion of the International Searching Authority issued in International Application No. PCT/JP2016/077125, dated Dec. 6, 2016.

* cited by examiner

CERAMIC MULTILAYER SUBSTRATE

CROSS REFERENCE TO RELATED APPLICATIONS

The present application is a continuation of International application No. PCT/JP2016/077125, filed Sep. 14, 2016, which claims priority to Japanese Patent Application No. 2015-185637, filed Sep. 18, 2015, the entire contents of each of which are incorporated herein by reference.

FIELD OF THE INVENTION

The present invention relates to a ceramic multilayer substrate in which a ceramic insulator layer, an inner pattern conductor, and an outer pattern conductor are stacked. In particular, the present invention relates to a ceramic multilayer substrate in which sintering shrinkage during firing is suppressed in a direction orthogonal to the stacking direction.

BACKGROUND OF THE INVENTION

Ceramic multilayer substrates are equipped with semiconductor devices, other electronic components, and the like and used to combine these electronic components with each other by wiring so as to form modules. Ceramic multilayer substrates include a plurality of stacked ceramic insulator layers and wiring conductors in various forms. Wiring conductors include an inner pattern conductor, an outer pattern conductor, an outer electrode, and a via hole conductor. The inner pattern conductor is disposed along a specific interface between ceramic insulator layers inside the ceramic multilayer substrate. The outer pattern conductor is disposed on the outer surface of the ceramic multilayer substrate. The via hole conductor is disposed so as to pass through specific ceramic insulator layers.

In order to make the ceramic multilayer substrate multifunctional, have a higher density, and achieve higher performance, it is effective to arrange the above-described wiring conductors in high density. Incidentally, a firing step is necessary for producing the ceramic multilayer substrate. However, during such a firing step, shrinkage of a ceramic material occurs due to sintering. The sintering shrinkage tends to occur unevenly in the entire ceramic multilayer substrate. Therefore, undesirable deformation or distortion may be caused in a wiring conductor. The occurrence of such deformation or distortion in the wiring conductor hinders the wiring conductors from being arranged in high density.

Then, it has been proposed to apply a so-called non-shrinkage process in which the occurrence of shrinkage in a principal surface direction of the ceramic multilayer substrate during a firing step can be substantially prevented when the ceramic multilayer substrate is produced.

In a method for manufacturing a ceramic multilayer substrate by the non-shrinkage process, a low-temperature sintering ceramic material that can be sintered at a temperature of, for example, 1,000° C. or lower is prepared and, in addition, an inorganic material powder that is not sintered at the sintering temperature of the above-described low-temperature sintering ceramic material and that performs the function of suppressing shrinkage is prepared.

Subsequently, a plurality of green sheets of base-member ceramic layers containing the low-temperature sintering ceramic material and green sheets of constraining layers containing the inorganic material powder that suppresses shrinkage are stacked, and wiring conductors related to the base-member ceramic layers are disposed so as to produce a multilayer body before firing, where the multilayer body after firing serves as a ceramic multilayer substrate. In this regard, the base-member ceramic layer is a ceramic layer that contributes to realization of the electrical characteristics of an insulator ceramic layer.

The multilayer body before firing, produced as described above, is fired. The multilayer body before firing has the above-described structure. Therefore, the base-member ceramic layer shrinks substantially in the thickness direction during the firing step, and shrinkage in the principal surface direction is suppressed. As a result, in the ceramic multilayer substrate produced by firing the multilayer body having the above-described structure before firing, uneven deformation does not easily occur.

Consequently, undesirable deformation or distortion does not occur easily in the wiring conductors, and the wiring conductors can be arranged in high density. Japanese Unexamined Patent Application Publication No. 2002-368421 (Patent Document 1) proposes an example of such a ceramic multilayer substrate.

FIG. 15 is a sectional view showing a ceramic multilayer substrate 200 described in Patent Document 1. The ceramic multilayer substrate 200 includes base-member ceramic layers 201, constraining layers 202 which are disposed in contact with the respective principal surfaces of specific base-member ceramic layers 201, inner pattern conductors 204, outer pattern conductors 205, and via conductors 207. The via conductors 207 pass through specific base-member ceramic layers 201, and connect specific inner pattern conductors 204 to each other or connect a specific inner pattern conductor 204 to an outer pattern conductor 205.

In this regard, as described above, the base-member ceramic layer 201 is composed of the low-temperature sintering ceramic material that can be sintered at a temperature of, for example, 1,000° C. or lower, and the constraining layer 202 is composed of a ceramic material that is not sintered at the sintering temperature of the above-described low-temperature sintering ceramic material.

In the ceramic multilayer substrate 200, when the base-member ceramic layer 201 is sintered, shrinkage in the principal surface direction is suppressed by the constraining layers 202. As a result, uneven deformation or distortion does not easily occur in the ceramic multilayer substrate 200. Consequently, it is mentioned that undesirable deformation or distortion does not occur easily in the wiring conductor, and the wiring conductors can be arranged in high density.

SUMMARY OF THE INVENTION

Incidentally, in order to make the ceramic multilayer substrate more multifunctional, have a still higher density, and achieve still higher performance, it is necessary to arrange the above-described wiring conductors in higher density. It is considered to be one measure to further decrease the thickness of the ceramic insulator layers and to decrease the distance between the inner pattern conductors, between the inner pattern conductor and the outer pattern conductor, or between the inner pattern conductor and the outer electrode for the purpose of increasing the density in arrangement of the wiring conductors in the stacking direction.

However, there is a concern that the above-described measure may cause reduction in insulation resistance between the wiring conductors in the stacking direction when a conductor component diffuses from the wiring conductor to the ceramic insulator layer during firing or a conductor component moves due to ion migration (electrochemical migration) in a wet environment.

Accordingly, it is an object of the present invention to provide a ceramic multilayer substrate in which insulation resistance between wiring conductors in the stacking direction is high even when the thickness of a ceramic insulator layer is decreased.

In a ceramic multilayer substrate according to the present invention, the structure of a ceramic insulator layer is improved for the purpose of suppressing reduction in the insulation resistance between wiring conductors in the stacking direction due to a decrease in the thickness of the ceramic insulator layer.

The ceramic multilayer substrate according to the present invention includes a ceramic insulator layer, which includes a first layer, a second layer, and a third layer and in which the first layer is interposed between the second layer and the third layer, and wiring conductors.

The wiring conductors include inner pattern conductors disposed inside the ceramic multilayer substrate and outer conductors disposed on the outer surface of the ceramic multilayer substrate. The ceramic insulator layer is interposed at least one of between the inner pattern conductor and the outer conductor and between two inner pattern conductors. Meanwhile, the sintering shrinkage start temperatures of the second layer alone and the third layer alone in a green sheet state are higher than or equal to the sintering shrinkage stop temperature of the first layer alone in a green sheet state.

The thickness of the ceramic insulator layer is 5.0 μm or more and 55.7 μm or less. In addition, the ratio of the total of the thickness of the second layer and the thickness of the third layer to the thickness of the first layer is 0.25 or more and 1.11 or less.

In the above-described ceramic multilayer substrate, the ceramic insulator layer has a structure in which the first layer is interposed between the second layer and the third layer. The sintering shrinkage start temperatures of the second layer alone and the third layer alone in a green sheet state are higher than or equal to the sintering shrinkage stop temperature of the first layer alone in a green sheet state. Therefore, the second layer and the third layer function as constraining layers that suppress shrinkage of the first layer in the principal surface direction during sintering of the first layer.

Further, each of the second layer and the third layer is interposed at least one of between the first layer serving as a base-member ceramic layer and the inner pattern conductor and between the first layer and the outer conductor while satisfying the above-described relationship. In addition, the second layer and the third layer are not sintered during sintering of the first layer, as described above, and therefore, are considered to be in a porous state. Consequently, when the thickness of each of the first to third layers satisfies the above-described relationship, a glass component, which is considered to be generated in the first layer during sintering, is consumed so as to be introduced into porous portions of the second layer and the third layer, and contact with the wiring conductor is suppressed. That is, the second layer and the third layer also serve as diffusion-suppressing layers so as to suppress diffusion of the conductor component from the wiring conductor to the first layer.

Therefore, even when the thickness of the ceramic insulator layer is decreased, a ceramic multilayer substrate having high insulation resistance between the wiring conductors in the stacking direction can be produced by the ceramic insulator layer having the above-described structure.

Preferably, the ceramic multilayer substrate according to the present invention has a feature described below. That is, the first layer is a ceramic layer containing a celsian-type compound that is formed by containing Ba, Si, and Al, and the second layer and the third layer are ceramic layers that are mixtures of $Al_2O_3$ or $ZrO_2$ and borosilicate glass.

In the above-described ceramic multilayer substrate, the first to third layers contain the above-described ceramic materials. Therefore, even when the wiring conductor is composed of a low-melting-point metal, e.g., Ag or Cu, or an alloy thereof, the first to third layers and the wiring conductor can be co-fired.

It is also preferable that the ceramic multilayer substrate according to the present invention have a feature described below. That is, an outer pattern conductor and an outer electrode are included as the outer conductors, and the ceramic insulator layer, in which the first layer is interposed between the second layer and the third layer, is interposed at least one of between the outer pattern conductor and the inner pattern conductor and between the inner pattern conductor and the outer electrode.

In the above-described ceramic multilayer substrate, the ceramic insulator layer, in which the first layer is interposed between the second layer and the third layer, is arranged in the vicinity of the surface that is readily affected by the humidity in the environmental atmosphere of the ceramic multilayer substrate. As a result, even when the conductor component of the outer pattern conductor or the outer conductor is ionized by the humidity in the environmental atmosphere and an applied voltage, the conductor component does not move into the first layer due to so-called ion migration (electrochemical migration).

Therefore, even when the thickness of a ceramic insulator layer is decreased and even in a wet environment, a ceramic multilayer substrate in which insulation resistance between wiring conductors in the stacking direction is high can be produced by adopting the above-described arrangement of the ceramic insulator layer.

Regarding the ceramic multilayer substrate according to the present invention, even when the thickness of a ceramic insulator layer is decreased, a ceramic multilayer substrate in which insulation resistance between wiring conductors in the stacking direction is high can be produced.

DETAILED DESCRIPTION OF THE PREFERRED EMBODIMENTS

The features of the present invention will be described below in further detail with reference to the embodiments according to the present invention.

First Embodiment of Ceramic Multilayer Substrate

A first embodiment of a ceramic multilayer substrate 100 according to the present invention will be described below with reference to FIG. 1 to FIG. 3. The ceramic multilayer substrate according to the present invention is applied to, for example, substrates of PA modules, RF diode switches, filters, chip antennas, various package components, and composite devices but not limited to these.

<<Structure of Ceramic Multilayer Substrate>>

Figure 1:
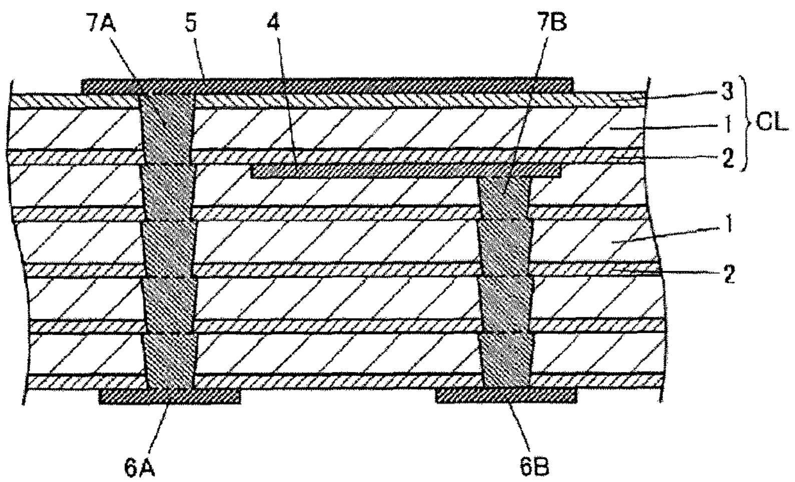
FIG. 1 is a sectional view of a ceramic multilayer substrate 100 that is a first embodiment of a ceramic multilayer substrate according to the present invention.

FIG. 1 is a sectional view of the ceramic multilayer substrate 100. The ceramic multilayer substrate 100 includes a first layer 1, a second layer 2, a third layer 3, a ceramic insulator layer CL in which the first layer 1 is interposed between the second layer 2 and the third layer 3, an inner pattern conductor 4, and outer conductors. In this regard, the outer conductors include an outer pattern conductor 5 and outer electrodes 6A and 6B. A via conductor 7A connects the outer pattern conductor 5 to the outer electrode 6A, and a via conductor 7B connects the inner pattern conductor 4 to the outer electrode 6B. In this regard, portions indicated by dotted lines in the drawing are virtual connection interfaces and do not represent the presence of any actual interface (hereafter the same applies).

The ceramic insulator layer CL is interposed between the inner pattern conductor 4 and the outer pattern conductor 5. Meanwhile, the sintering shrinkage start temperatures of the second layer 2 alone and the third layer 3 alone in a green sheet state are higher than or equal to the sintering shrinkage stop temperature of the first layer 1 alone in a green sheet state. That is, the second layer 2 and the third layer 3 serve as constraining layers so as to suppress sintering shrinkage of the first layer 1 serving as a base-material ceramic layer. In this regard, in the present embodiment, ceramic material layers other than the ceramic insulator layer CL in the ceramic multilayer substrate 100 are first layers 1 and second layers 2.

Here, the thickness of the ceramic insulator layer CL is 5.0 μm or more and 55.7 μm or less. Meanwhile, the ratio of the total of the thickness of the second layer 2 and the thickness of the third layer 3 to the thickness of the first layer 1 is 0.25 or more and 1.11 or less.

As described above, when the first layer 1, the second layer 2, and the third layer 3 satisfy the above-described relationship, the second layer and the third layer also function as diffusion-suppressing layers so as to suppress diffusion of the conductor component from the wiring conductor to the first layer. Therefore, as shown in experimental examples described later, even when the thickness of the ceramic insulator layer CL is decreased to 5.0 μm, the ceramic multilayer substrate 100 having high insulation resistance between the wiring conductors in the stacking direction (in the present embodiment, between the inner pattern conductor 4 and the outer pattern conductor 5) can be produced by the ceramic insulator layer CL having the above-described structure.

<<Method for Manufacturing Ceramic Multilayer Substrate>>

An example of the method for manufacturing the ceramic multilayer substrate 100 according to the first embodiment of the present invention will be described with reference to FIG. 2 and FIG. 3. FIG. 2 and FIG. 3 are schematic diagrams showing a first step to a sixth step that are performed sequentially in an example of the method for manufacturing the ceramic multilayer substrate 100. In this regard, FIG. 2 and FIG. 3 illustrate a portion corresponding to the right half (the via conductor 7B and the vicinity thereof) of the ceramic multilayer substrate 100, and a portion corresponding to the left half (the via conductor 7A and the vicinity thereof) is not shown in the drawings.

<First Step>

Figure 2:
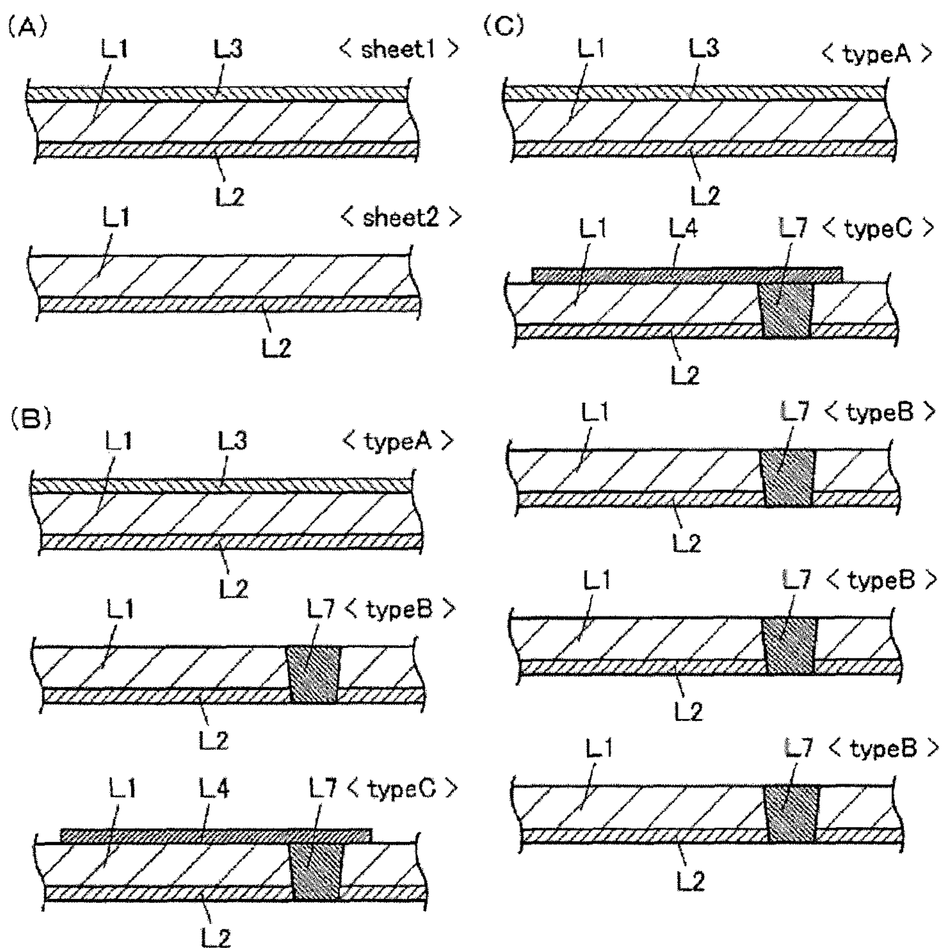
FIG. 2 is a diagram illustrating an example of a method for manufacturing the ceramic multilayer substrate 100 and is a schematic diagram showing a first step (green sheet production step) to a third step (green sheet stacking step).

FIG. 2, part (A) is a schematic diagram showing the first step (green sheet production step) of the method for manufacturing the ceramic multilayer substrate 100. Hereafter, "in a green sheet state" or "in an unsintered state" may be referred to as "green". In the first step, a first composite green sheet (Sheet 1) in which a green first layer L1 is interposed between a green second layer L2 and a green third layer L3 and a second composite green sheet (Sheet 2) in which the green first layer L1 is disposed on the upper surface of the green second layer L2 in the drawing are produced.

Sheet 1 can be produced by producing a slurry for producing each of the green first layer L1, the green second layer L2, and the green third layer L3 and coating a base-member film with these in the order of the initial green second layer L2, the next green first layer L1, and the last green third layer L3.

Regarding the slurry for forming the green first layer L1, for example, raw material powders such as $BaCO_3$, $SiO_2$, $Al_2O_3$, $ZrO_2$, and $MnCO_3$ are mixed such that a celsian-type compound that is formed by containing Ba, Si, and Al is formed after firing, and the resulting mixed powder is made into a slurry by a known method. Regarding the slurry for forming the green second layer L2 and the green third layer L3, raw material powders, $Al_2O_3$ and borosilicate glass, are mixed at a predetermined weight ratio, and the resulting mixed powder is made into a slurry in the same manner. In this regard, the types of the slurries for forming the green second layer L2 and the green third layer L3 may be different from each other.

Sheet 2 can be produced by producing a slurry for producing each of the green first layer L1 and the green second layer L2 and coating a base-member film with these in the order of the initial green second layer L2 and the next green first layer L1.

<Second Step>

FIG. 2, part (B) is a schematic diagram showing the second step (wiring conductor formation step) of the method for manufacturing the ceramic multilayer substrate 100. A green via conductor L7 (not shown in the drawing) that is to be made into a via conductor 7A is formed in Sheet 1 produced in the first step so as to provide an A type wiring-conductor-forming sheet (type A). Likewise, a green via conductor L7 (not shown in the drawing) that is to be made into the via conductor 7A and a green via conductor L7 that is to be made into a via conductor 7B are formed in Sheet 2 so as to provide a B type wiring-conductor-forming sheet (type B).

Further, a green via conductor L7 (not shown in the drawing) that is to be made into the via conductor 7A, a green via conductor L7 that is to be made into the via conductor 7B, and a green inner pattern conductor L4 connected to the latter green via conductor L7 are formed with respect to Sheet 2 so as to provide a C type wiring-conductor-forming sheet (type C). Each of the green wiring conductors can be formed by, for example, applying a conductor paste containing Cu as a conductor component.

In this regard, in FIG. 2, part (B), a green inner pattern conductor L4 is formed on the upper surface of Sheet 2 in the drawing so as to provide a C type wiring-conductor-forming sheet. However, as is clear from FIG. 2, part (C) illustrating the green sheet stacking step described below, the green inner pattern conductor L4 has only to be formed between Sheet 1 and Sheet 2. That is, the green inner pattern conductor L4 may be formed on the lower surface of Sheet 1 so as to produce another type of wiring-conductor-forming sheet.

<Third Step>

FIG. 2, part (C) is a schematic diagram showing the third step (green sheet stacking step) of the method for manufacturing the ceramic multilayer substrate 100. The wiring-conductor-forming sheet of each of type A, type B, and type C produced in the second step is stacked in the order shown in FIG. 2, part (C).

<Fourth Step>

Figure 3:
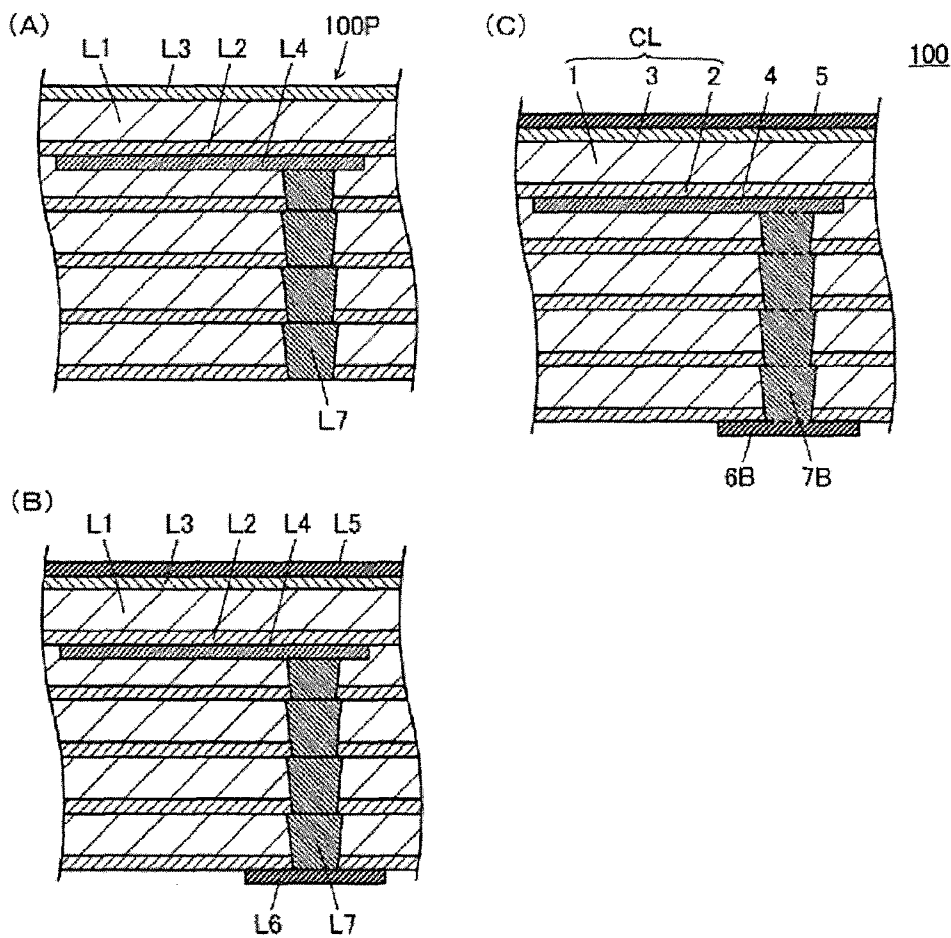
FIG. 3 is a schematic diagram illustrating an example of a method for manufacturing the ceramic multilayer substrate 100 and is a schematic diagram showing a fourth step (pressure bonding step) to a sixth step (firing step).

FIG. 3, part (A) is a schematic diagram showing the fourth step (pressure bonding step) of the method for manufacturing the ceramic multilayer substrate 100. Each of the wiring-conductor-forming sheets stacked in the third step is thermocompression-bonded under a predetermined condition so as to produce a pressure-bonded body 100P. As a result, the green via conductor L7 disposed in each of the wiring-conductor-forming sheets is connected to each other. In this regard, it is preferable that the pressure-bonded body 100P be an assembly of green ceramic multilayer substrates and be cut into individual pieces after the fifth step (outer pattern conductor and pressure bonding step) described below is finished.

<Fifth Step>

FIG. 3, part (B) is a schematic diagram showing the fifth step (unsintered outer conductor formation step) of the method for manufacturing the ceramic multilayer substrate 100. A green outer pattern conductor L5 and a green outer electrode L6 (not shown in the drawing) are formed on the upper surface and the lower surface, respectively, of the pressure-bonded body 100P in the drawing so as to realize connections to the green via conductor L7 (not shown in the drawing) that is to be made into the via conductor 7A in the pressure-bonded body 100P produced in the fourth step. Also, a green outer electrode L6 is formed on the lower surface of the pressure-bonded body 100P in the drawing so as to realize connections to a green via conductor L7 that is to be made into the via conductor 7B.

The above-described step is performed so as to co-fire the pressure-bonded body 100P and the outer conductor. Alternatively, instead of co-firing the pressure-bonded body 100P and the outer conductor, the outer conductor may be formed after the pressure-bonded body 100P is fired.

<Sixth Step>

FIG. 3, part (C) is a schematic diagram showing the sixth step (firing step) of the method for manufacturing the ceramic multilayer substrate 100. The pressure-bonded body 100*p* which are produced in the fifth step and which includes the green outer conductor is fired under a predetermined condition so as to produce the ceramic multilayer substrate 100 according to the present invention. In this regard, after the firing step, a Ni plating film and an Au plating film may be formed on the surface of each of the outer pattern conductor 5 and the outer electrodes 6A (not shown in the drawing) and 6B.

The ceramic multilayer substrate 100 according to the present invention can be efficiently produced by performing each of the above-described steps.

Second Embodiment of Ceramic Multilayer Substrate

A ceramic multilayer substrate 100A that is a second embodiment of the ceramic multilayer substrate according to the present invention will be described with reference to FIG. 4 to FIG. 6.

<<Structure of Ceramic Multilayer Substrate>>

Figure 4:
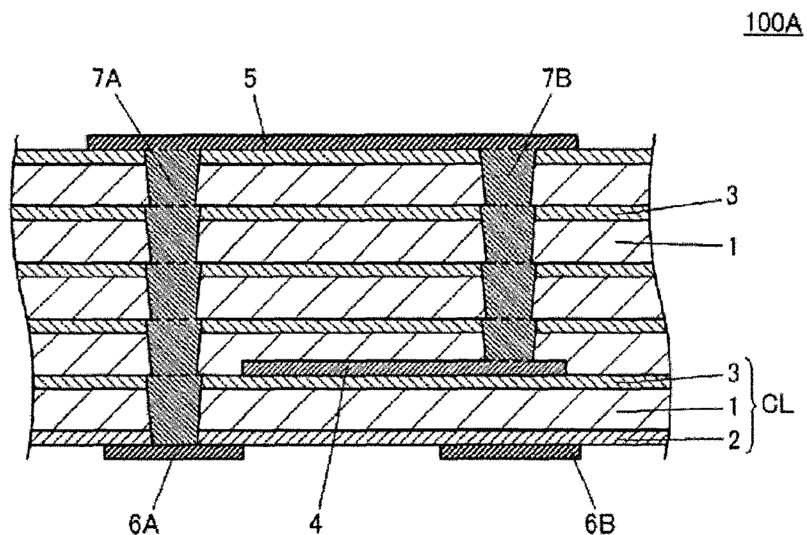
FIG. 4 is a sectional view of a ceramic multilayer substrate 100A that is a second embodiment of the ceramic multilayer substrate according to the present invention.

FIG. 4 is a sectional view of the ceramic multilayer substrate 100A. The ceramic multilayer substrate 100A is different from the ceramic multilayer substrate 100 in the location of the ceramic insulator layer CL and the location of the via conductor 7B. The other portions are the same as those in the ceramic multilayer substrate 100 and, therefore, explanations of the same portions will not be provided.

In the ceramic multilayer substrate 100A, the ceramic insulator layer CL is interposed between the inner pattern conductor 4 and the outer electrode 6B serving as the outer conductor. Accordingly, the via conductor 7B connects the inner pattern conductor 4 to the outer pattern conductor 5. In this regard, in the present embodiment, the ceramic material layers other than the ceramic insulator layer CL in the ceramic multilayer substrate 100 are first layers 1 and third layers 3.

When the ceramic insulator layer CL has the above-described structure and the thickness of the ceramic insulator layer CL and the relationship represented by the ratio of the total of the thickness of the second layer 2 and the thickness of the third layer 3 to the thickness of the first layer 1 are set so as to fall within the regulations according to the present invention, the ceramic multilayer substrate 100A can also have high insulation resistance between the wiring conductors in the stacking direction (in the present embodiment, between the inner pattern conductor 4 and the outer electrode 6B) even when the thickness of the ceramic insulator layer CL is decreased to 5.0 μm, in the same manner as the ceramic multilayer substrate 100.

<<Method for Manufacturing Ceramic Multilayer Substrate>>

An example of the method for manufacturing the ceramic multilayer substrate 100A according to the second embodiment of the present invention will be described with reference to FIG. 5 and FIG. 6. FIG. 5 and FIG. 6 are schematic diagrams showing a first step to a sixth step that are performed sequentially in an example of the method for manufacturing the ceramic multilayer substrate 100A. In this regard, with respect to FIG. 5 and FIG. 6, a portion corresponding to the left half (the via conductor 7A and the vicinity thereof) of the ceramic multilayer substrate 100A is not shown in the drawings in the same manner as FIG. 2 and FIG. 3.

The method for manufacturing the ceramic multilayer substrate 100A described below is different from the above-described method for manufacturing the ceramic multilayer substrate 100 in the first step (green sheet production step), the second step (wiring conductor formation step), the third step (green sheet stacking step), and the fifth step (unsintered outer conductor formation step). The other steps are the same as those in the method for manufacturing the ceramic multilayer substrate 100 and, therefore, explanations of the same portions will not be provided or be simplified.

<First Step>

Figure 5:
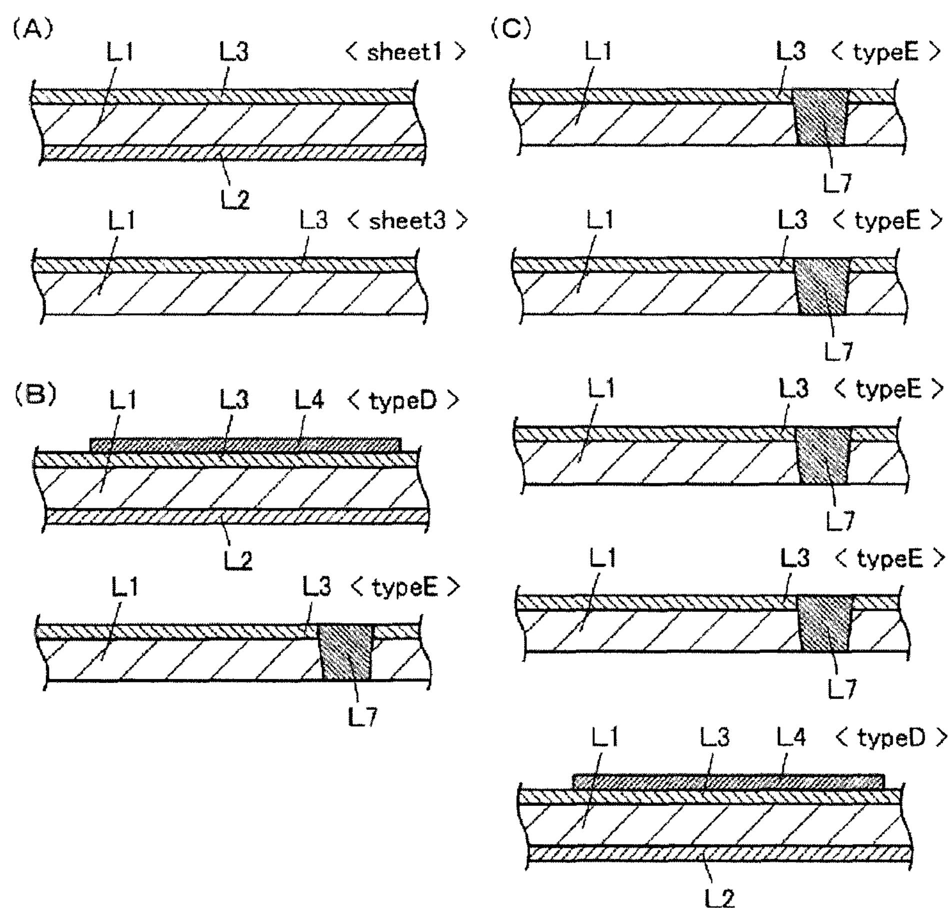
FIG. 5 is a diagram illustrating an example of a method for manufacturing the ceramic multilayer substrate 100A and is a schematic diagram showing a first step (green sheet production step) to a third step (green sheet stacking step).

FIG. 5, part (A) is a schematic diagram showing the first step (green sheet production step) of the method for manufacturing the ceramic multilayer substrate 100A. In the first step, Sheet 1 described in the first embodiment and a third composite green sheet (Sheet 3) in which the green third layer L3 is disposed on the upper surface of the green first layer L1 in the drawing are produced.

Sheet 3 can be produced by producing a slurry for forming each of the green first layer L1 and the green third layer L3 and coating a base-member film with these in the order of the initial green first layer L1 and the next green third layer L3. In this regard, the slurries for forming the green first layer L1 and the green third layer L3 are the same as those described in the first embodiment.

<Second Step>

FIG. 5, part (B) is a schematic diagram showing the second step (wiring conductor formation step) of the method for manufacturing the ceramic multilayer substrate 100A. A green via conductor L7 (not shown in the drawing) that is to be made into a via conductor 7A and a green inner pattern conductor L4 are formed with respect to Sheet 1 produced in the first step so as to provide a D type wiring-conductor-forming sheet (type D).

In addition, a green via conductor L7 (not shown in the drawing) that is to be made into the via conductor 7A and a green via conductor L7 that is to be made into a via conductor 7B are formed in Sheet 3 so as to provide an E type wiring-conductor-forming sheet (type E). Each of the green wiring conductors can be formed by, for example, applying a conductor paste containing Cu as a conductor component in the same manner as that described in the first embodiment.

In this regard, in FIG. 5, part (B), a green inner pattern conductor L4 is formed on the upper surface of Sheet 1 in the drawing so as to provide a D type wiring-conductor-forming sheet. However, as is clear from FIG. 5, part (C) illustrating the green sheet stacking step described below, the green inner pattern conductor L4 has only to be formed between Sheet 3 and Sheet 1. That is, the green inner pattern conductor L4 may be formed on the lower surface of Sheet 3 so as to produce another type of wiring-conductor-forming sheet.

<Third Step>

FIG. 5, part (C) is a schematic diagram showing the third step (green sheet stacking step) of the method for manufacturing the ceramic multilayer substrate 100A. Each of the wiring-conductor-forming sheets of type D and type E produced in the second step is stacked in the order shown in FIG. 5, part (C).

<Fourth Step>

Figure 6:
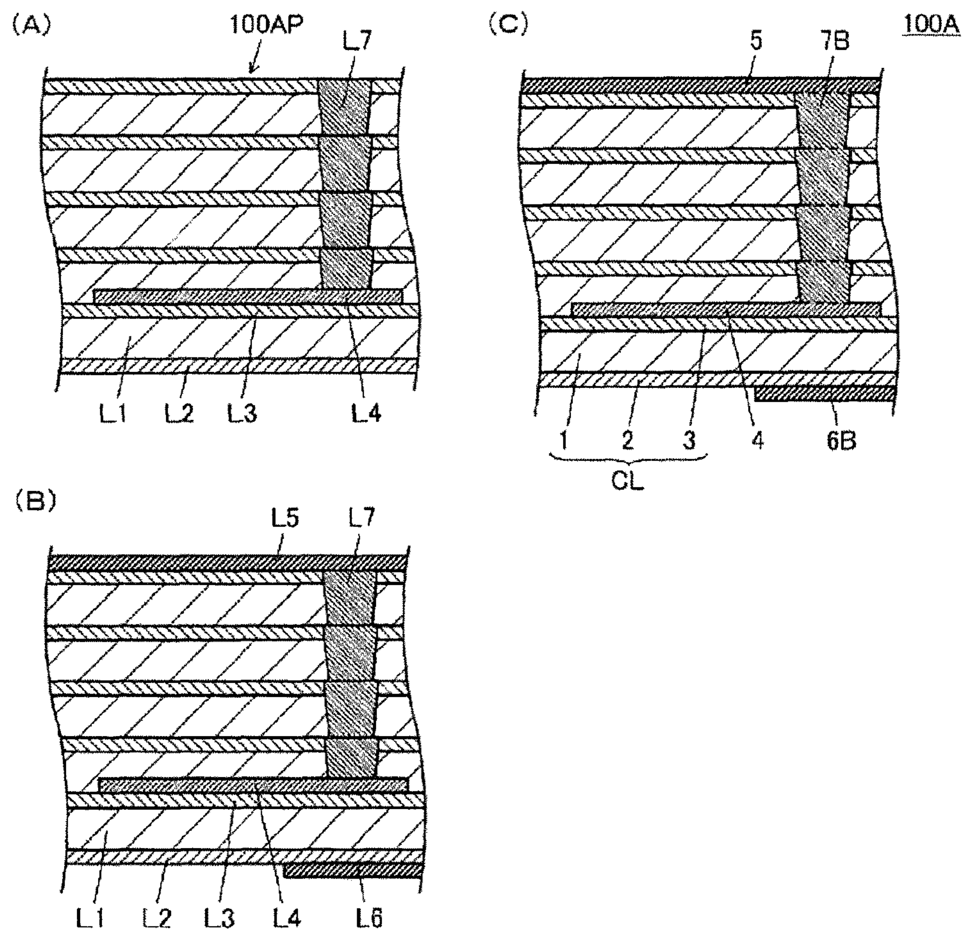
FIG. 6 is a schematic diagram illustrating an example of a method for manufacturing the ceramic multilayer substrate 100A and is a schematic diagram showing a fourth step (pressure bonding step) to a sixth step (firing step).

The fourth step (pressure bonding step, refer to FIG. 6, part (A)) is the same as the fourth step in the first embodiment. As a result, a pressure-bonded body 100AP is produced and, at that time, the green via conductor L7 disposed in each of the wiring-conductor-forming sheets is connected to each other, and the green inner pattern conductor L4 is connected to the green via conductor L7.

<Fifth Step>

FIG. 6, part (B) is a schematic diagram showing the fifth step (unsintered outer conductor formation step) of the method for manufacturing the ceramic multilayer substrate 100A. A green outer pattern conductor L5 and a green outer electrode L6 (not shown in the drawing) are formed on the upper surface and the lower surface, respectively, of the pressure-bonded body 100AP in the drawing so as to realize connections to the green via conductor L7 (not shown in the drawing) that is to be made into the via conductor 7A in the pressure-bonded body 100AP produced in the fourth step. Also, a green outer electrode L6 is formed on the lower surface of the pressure-bonded body 100AP in the drawing at a location opposite to the green inner pattern conductor L4 with Sheet 1 interposed therebetween.

The above-described step is performed so as to co-fire the pressure-bonded body 100AP and the outer conductor. Alternatively, instead of co-firing the pressure-bonded body 100AP and the outer conductor, the outer conductor may be formed after the pressure-bonded body 100AP is fired, as in the first embodiment.

<Sixth Step>

The sixth step (pressure bonding step, refer to FIG. 6, part (C)) is the same as the sixth step in the first embodiment.

The ceramic multilayer substrate 100A according to the present invention can be efficiently produced by performing each of the above-described steps.

Third Embodiment of Ceramic Multilayer Substrate

A ceramic multilayer substrate 100A that is a third embodiment of the ceramic multilayer substrate according to the present invention will be described with reference to FIG. 7 to FIG. 9.

<<Structure of Ceramic Multilayer Substrate>>

Figure 7:
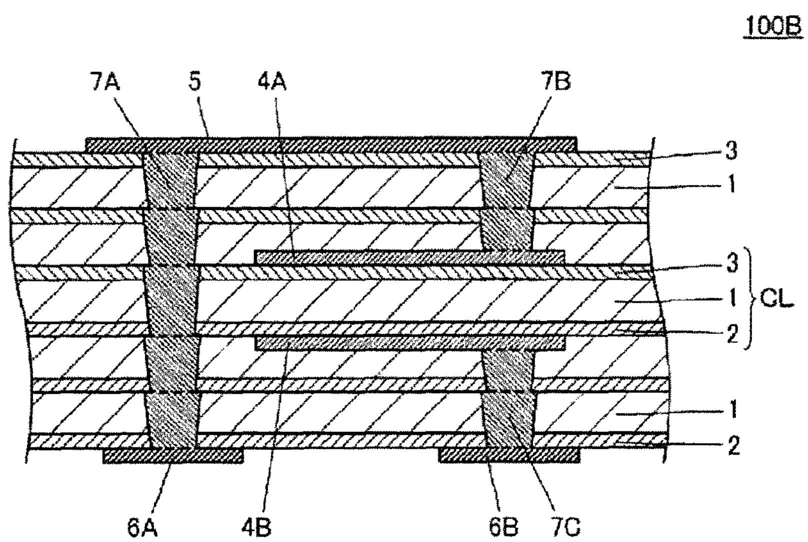
FIG. 7 is a sectional view of a ceramic multilayer substrate 100B that is a third embodiment of the ceramic multilayer substrate according to the present invention.

FIG. 7 is a sectional view of the ceramic multilayer substrate 100B. The ceramic multilayer substrate 100B is different from the ceramic multilayer substrate 100 in the location of the ceramic insulator layer CL and the locations of the via conductors 7B and 7C. The other portions are the same as those in the ceramic multilayer substrate 100 and, therefore, explanations of the same portions will not be provided.

In the ceramic multilayer substrate 100B, the ceramic insulator layer CL is interposed between two inner pattern conductors 4A and 4B. Accordingly, the via conductor 7B connects the inner pattern conductor 4A to the outer pattern conductor 5, and the via conductor 7C connects the inner pattern conductor 4B to the outer electrode 6B. In this regard, in the present embodiment, the ceramic material layers other than the ceramic insulator layer CL in the ceramic multilayer substrate 100 are first layers 1, second layers 2, and third layers 3.

When the ceramic insulator layer CL has the above-described structure and the thickness of the ceramic insulator layer CL and the relationship represented by the ratio of the total of the thickness of the second layer 2 and the thickness of the third layer 3 to the thickness of the first layer 1 are set so as to fall within the regulations according to the present invention, the ceramic multilayer substrate 100B can also have high insulation resistance between the wiring conductors in the stacking direction (in the present embodiment, between the two inner pattern conductors 4A and 4B) even when the thickness of the ceramic insulator layer CL is decreased to 5.0 μm, in the same manner as the ceramic multilayer substrates 100 and 100A.

<<Method for Manufacturing Ceramic Multilayer Substrate>>

An example of the method for manufacturing the ceramic multilayer substrate 100B according to the third embodiment of the present invention will be described with reference to FIG. 8 and FIG. 9. FIG. 8 and FIG. 9 are schematic diagrams showing a first step to a sixth step that are performed sequentially in an example of the method for manufacturing the ceramic multilayer substrate 100B. In this regard, with respect to FIG. 8 and FIG. 9, a portion corresponding to the left half (the via conductor 7A and the vicinity thereof) of the ceramic multilayer substrate 100B is not shown in the drawings in the same manner as FIG. 2 and FIG. 3.

The method for manufacturing the ceramic multilayer substrate 100B described below is different from the above-described method for manufacturing the ceramic multilayer substrate 100 in the first step (green sheet production step), the second step (wiring conductor formation step), the third step (green sheet stacking step), and the fifth step (unsintered outer conductor formation step) in the same manner as the method for manufacturing the ceramic multilayer substrate 100A. The other steps are the same as those in the method for manufacturing the ceramic multilayer substrate 100 and, therefore, explanations of the same portions will not be provided or be simplified.

<First Step>

Figure 8:
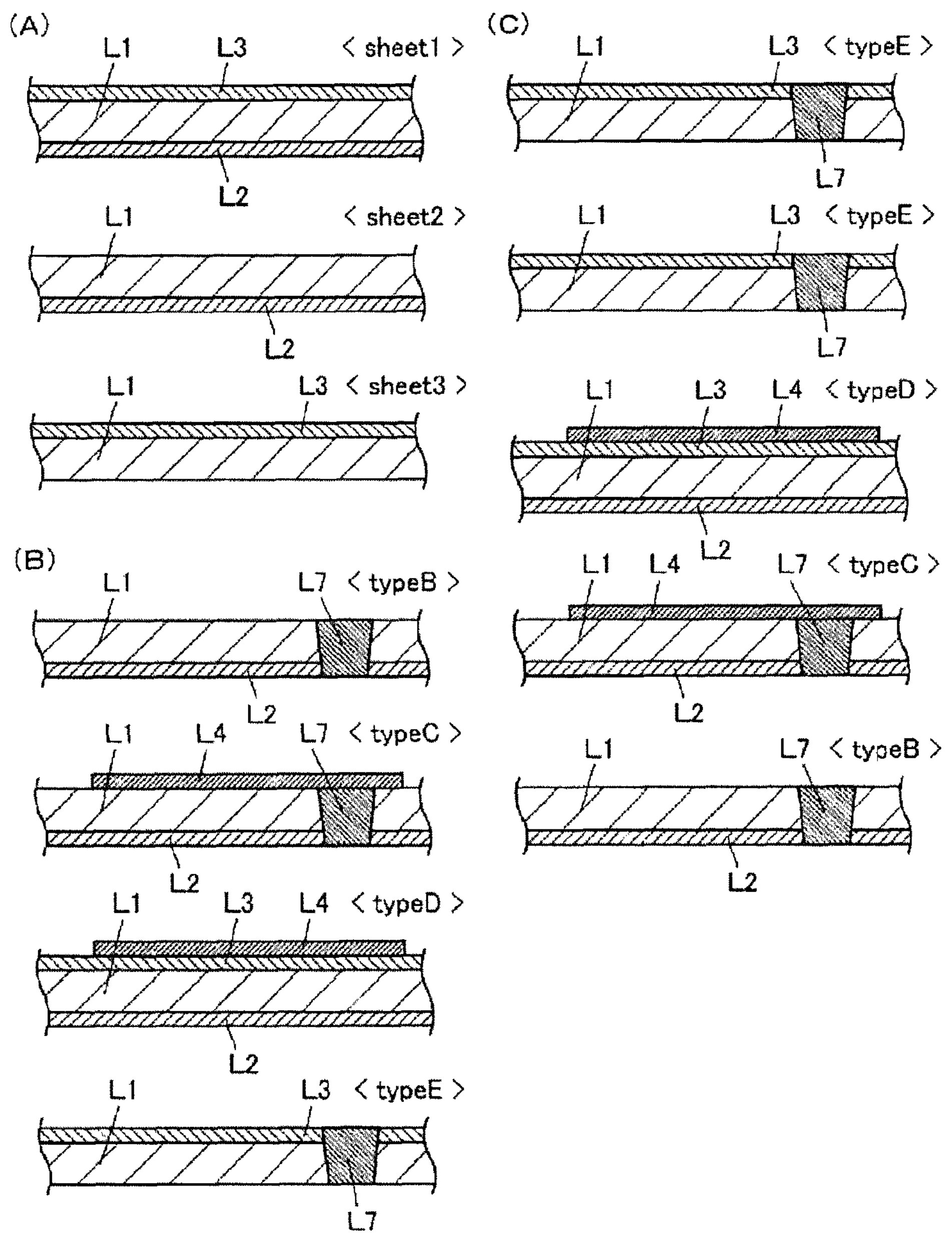
FIG. 8 is a diagram illustrating an example of a method for manufacturing the ceramic multilayer substrate 100B and is a schematic diagram showing a first step (green sheet production step) to a third step (green sheet stacking step).

FIG. 8, part (A) is a schematic diagram showing the first step (green sheet production step) of the method for manufacturing the ceramic multilayer substrate 100B. In the first step, each of the composite green sheets of Sheet 1, Sheet 2, and Sheet 3 described in the first and second embodiments is produced. The methods for manufacturing Sheet 1, Sheet 2, and Sheet 3 are the same as those described in the first embodiment and the second embodiment.

<Second Step>

FIG. 8, part (B) is a schematic diagram showing the second step (wiring conductor formation step) of the method for manufacturing the ceramic multilayer substrate 100B. In the second step, each of the wiring-conductor-forming sheets of type B, type C, type D, and type E described in the first and second embodiments is produced. The methods for manufacturing the type B, type C, type D, and type E wiring-conductor-forming sheets are the same as those described in the first embodiment and the second embodiment. In this regard, as described in the first embodiment and the second embodiment, the composite green sheet to be provided with the green inner pattern conductor L4 is not limited to the composite green sheets illustrated in FIG. 8, part (B).

<Third Step>

FIG. 8, part (C) is a schematic diagram showing the third step (green sheet stacking step) of the method for manufacturing the ceramic multilayer substrate 100B. Each of the wiring-conductor-forming sheets of type B, type C, type D, and type E produced in the second step is stacked in the order shown in FIG. 8, part (C).

<Fourth Step>

Figure 9:
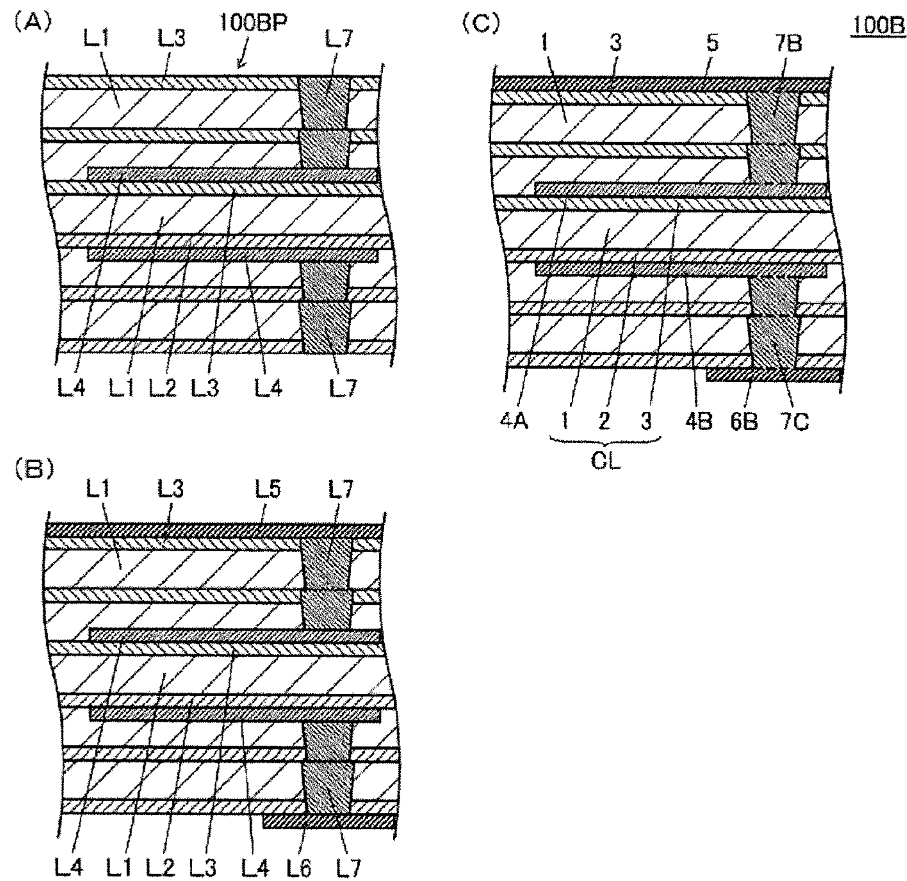
FIG. 9 is a schematic diagram illustrating an example of a method for manufacturing the ceramic multilayer substrate 100B and is a schematic diagram showing a fourth step (pressure bonding step) to a sixth step (firing step).

The fourth step (pressure bonding step, refer to FIG. 9, part (A)) is the same as the fourth step in the first embodiment. As a result, a pressure-bonded body 100BP is produced and, at that time, the green via conductor L7 disposed in each of the wiring-conductor-forming sheets is connected to each other, and the green inner pattern conductor L4 is connected to the green via conductor L7.

<Fifth Step>

FIG. 9, part (B) is a schematic diagram showing the fifth step (unsintered outer conductor formation step) of the method for manufacturing the ceramic multilayer substrate 100B. A green outer pattern conductor L5 is formed on the upper surface of the pressure-bonded body 100BP in the drawing so as to realize connections to the green via conductor L7 (not shown in the drawing) that is to be made into the via conductor 7A and to the green via conductor L7 that is to be made into the via conductor 7B in the pressure-bonded body 100BP produced in the fourth step.

Also, a green outer electrode L6 (not shown in the drawing) is formed on the lower surface of the pressure-bonded body 100P in the drawing so as to realize connections to the green via conductor L7 (not shown in the drawing) that is to be made into the via conductor 7A. Further, a green outer electrode L6 is formed on the lower surface of the pressure-bonded body 100P in the drawing so as to realize connections to the green via conductor L7 that is to be made into the via conductor 7C.

The above-described step is performed so as to co-fire the pressure-bonded body 100BP and the outer conductor. Alternatively, instead of co-firing the pressure-bonded body 100BP and the outer conductor, the outer conductor may be formed after the pressure-bonded body 100BP is fired, as in the first and second embodiments.

<Sixth Step>

The sixth step (pressure bonding step, refer to FIG. 9, part (C)) is the same as the sixth step in the first embodiment.

The ceramic multilayer substrate 100B according to the present invention can be efficiently produced by performing each of the above-described steps.

Fourth Embodiment of Ceramic Multilayer Substrate

A ceramic multilayer substrate 100C that is a fourth embodiment of the ceramic multilayer substrate according to the present invention will be described with reference to FIG. 10 to FIG. 12.

<<Structure of Ceramic Multilayer Substrate>>

Figure 10:
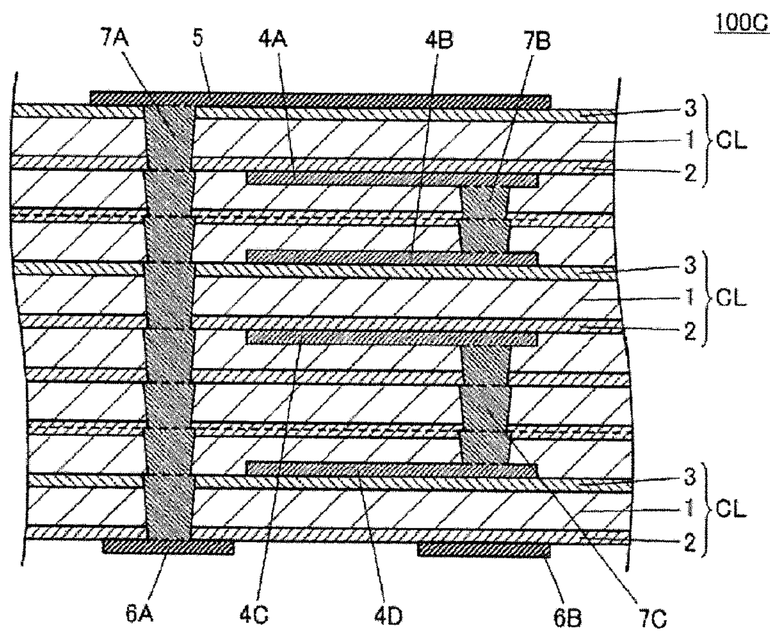
FIG. 10 is a sectional view of a ceramic multilayer substrate 100C that is a fourth embodiment of the ceramic multilayer substrate according to the present invention.

FIG. 10 is a sectional view of the ceramic multilayer substrate 100C. The ceramic multilayer substrate 100C is different from the ceramic multilayer substrate 100 in the location of the ceramic insulator layer CL and the locations of the via conductors 7B and 7C. The other portions are the same as those in the ceramic multilayer substrate 100 and, therefore, explanations of the same portions will not be provided.

In the ceramic multilayer substrate 100C, three ceramic insulator layers CL are interposed between an inner pattern conductor 4A and an outer pattern conductor 5 serving as an outer conductor, between two inner pattern conductors 4B and 4C, and between an inner pattern conductor 4D and an outer electrode 6B serving as an outer conductor, respectively. Accordingly, the via conductor 7B connects the inner pattern conductor 4A to the inner pattern conductor 4B, and the via conductor 7C connects the inner pattern conductor 4C to the inner pattern conductor 4D. In this regard, in the present embodiment, the ceramic material layers other than the ceramic insulator layer CL in the ceramic multilayer substrate 100 are first layers 1, second layers 2, and third layers 3.

When the ceramic insulator layer CL has the above-described structure and the thickness of the ceramic insulator layer CL and the relationship represented by the ratio of the total of the thickness of the second layer 2 and the thickness of the third layer 3 to the thickness of the first layer 1 are set so as to fall within the regulations according to the present invention, the ceramic multilayer substrate 100C can also have high insulation resistance between the wiring conductors in the stacking direction (in the present embodiment, between the inner pattern conductor 4A and the outer pattern conductor 5, between the two inner pattern conductors 4A and 4B, and between an inner pattern conductor 4 and an outer electrode 6B) even when the thickness of the ceramic insulator layer CL is decreased to 5.0 μm, in the same manner as the ceramic multilayer substrates 100, 100A, and 100B.

<<Method for Manufacturing Ceramic Multilayer Substrate>>

An example of the method for manufacturing the ceramic multilayer substrate 100C according to the fourth embodiment of the present invention will be described with reference to FIG. 11 and FIG. 12. FIG. 11 and FIG. 12 are schematic diagrams showing a first step to a sixth step that are performed sequentially in an example of the method for manufacturing the ceramic multilayer substrate 100C. In this regard, with respect to FIG. 11 and FIG. 12, a portion corresponding to the left half (the via conductor 7A and the vicinity thereof) of the ceramic multilayer substrate 100C is not shown in the drawings in the same manner as FIG. 2 and FIG. 3.

The method for manufacturing the ceramic multilayer substrate 100C described below is different from the above-described method for manufacturing the ceramic multilayer substrate 100 in the first step (green sheet production step), the second step (wiring conductor formation step), the third step (green sheet stacking step), and the fifth step (unsintered outer conductor formation step) in the same manner as the method for manufacturing the ceramic multilayer substrates 100A and 100B. The other steps are the same as those in the method for manufacturing the ceramic multilayer substrate 100 and, therefore, explanations of the same portions will not be provided or be simplified.

<First Step>

Figure 11:
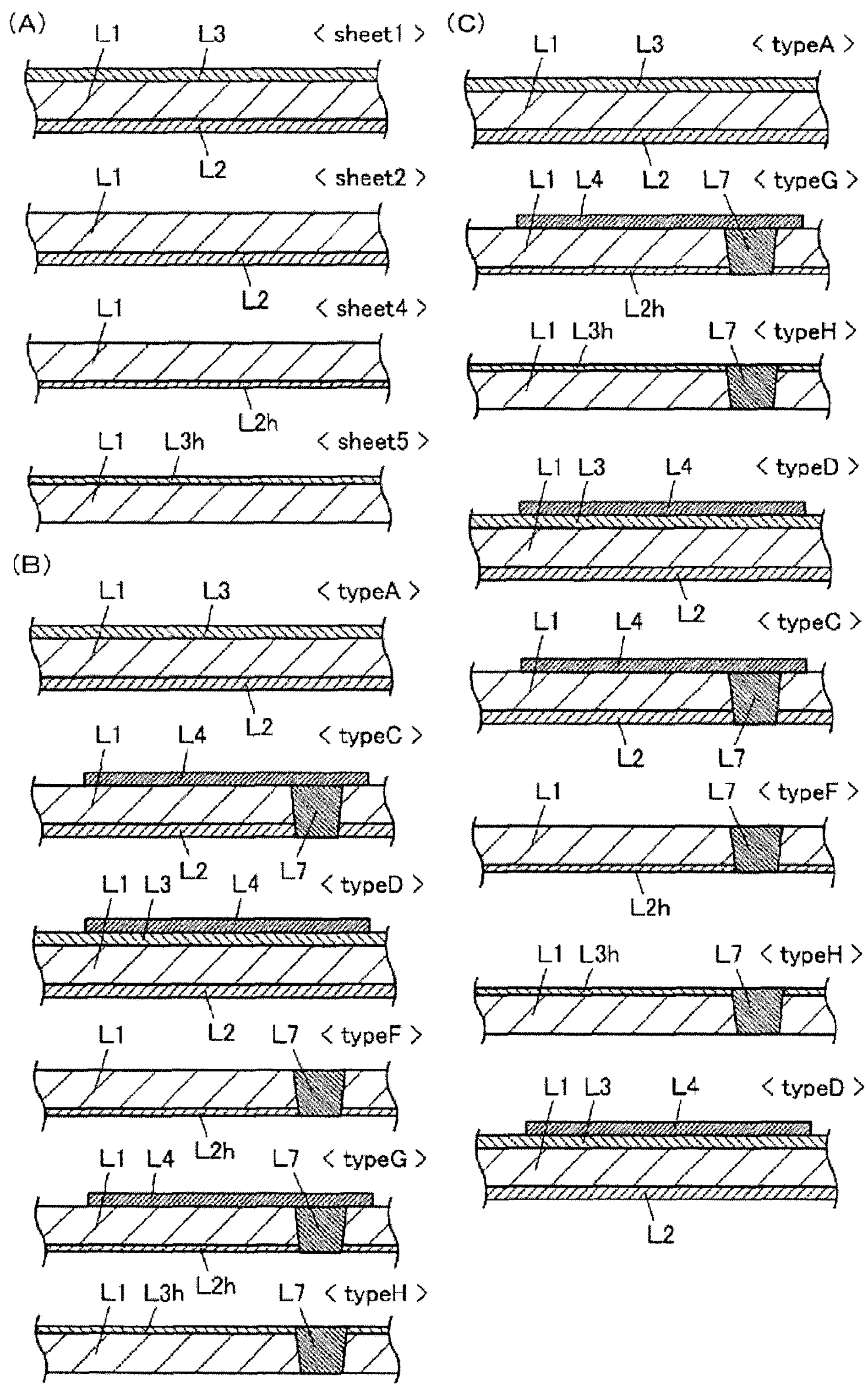
FIG. 11 is a diagram illustrating an example of a method for manufacturing the ceramic multilayer substrate 100C and is a schematic diagram showing a first step (green sheet production step) to a third step (green sheet stacking step).

FIG. 11, part (A) is a schematic diagram showing the first step (green sheet production step) of the method for manufacturing the ceramic multilayer substrate 100B. In the first step, each of the composite green sheets of Sheet 1 and Sheet 2 described in the first embodiment, a fourth composite green sheet (Sheet 4) in which a green first layer L1 is disposed on the upper surface (in the drawing) of a green second layer L2*h* having a thickness one-half the thickness of the green second layer L2 described above, and a fifth composite green sheet (Sheet 5) in which a green third layer L3*h* having a thickness one-half the thickness of the green third layer L3 described above is disposed on the upper surface (in the drawing) of a green first layer L1 are produced.

Sheet 4 can be produced by producing a slurry for forming each of the green first layer L1 and the green second layer L2*h* and coating a base-member film with these in the order of the initial green second layer L2*h* having a thickness one-half the thickness of the green second layer L2 described above and the next green first layer L1. In this regard, the slurry used to form the green second layer L2*h* is the same as the slurry used to form the second layer L2 described in the first embodiment.

Sheet 5 can be produced by producing slurry for forming each of the green first layer L1 and the green third layer L3*h* and coating a base-member film with these in the order of the initial green first layer L1 and the next green third layer L3*h* having a thickness one-half the thickness of the green third layer L3 described above. In this regard, the slurry used to form the green third layer L3*h* is the same as the slurry used to form the third layer L3 described in the second embodiment.

In this regard, in the present embodiment, for the purpose of equalizing the thickness of each of the constraining layers in the ceramic multilayer substrate 100C (refer to explanations in the first embodiment), Sheet 4 including the green second layer L2*h* and Sheet 5 including the green third layer L3*h* are produced such that the thickness of pressure-bonded green second layer L2*h* and green third layer L3*h* becomes equal to the thickness of the green second layer L2 or the green third layer L3 described above when thermocompression bonding is performed in the pressure-bonding step described later. In this case, in particular, there is an advantage that internal distortion of a ceramic multilayer substrate in which thin ceramic material layers are stacked can be reduced to a great extent.

In some cases, no problem occurs even when, for example, a ceramic material layer has a large thickness and there are variations in the thickness of each of the constraining layers. In this case, Sheet 2 may be used in place of Sheet 4 and Sheet 3 may be used in place of Sheet 5 without forming the composite green sheets of Sheet 4 and Sheet 5.

<Second Step>

FIG. 11, part (B) is a schematic diagram showing the second step (wiring conductor formation step) of the method for manufacturing the ceramic multilayer substrate 100C. In the second step, each of the wiring-conductor-forming sheets of type A, type C, and type D described in the first and second embodiments is produced.

In addition, regarding Sheet 4 in the second step, a green via conductor L7 (not shown in the drawing) that is to be made into the via conductor 7A and a green via conductor L7 that is to be made into a via conductor 7B are formed so as to provide an F type wiring-conductor-forming sheet (type F). Likewise, regarding Sheet 4, a green via conductor L7 (not shown in the drawing) that is to be made into the via conductor 7A, a green via conductor L7 that is to be made into a via conductor 7B, and a green inner pattern conductor L4 connected to the via conductor 7B are formed so as to provide a G type wiring-conductor-forming sheet (type G).

Further, regarding Sheet 5, a green via conductor L7 (not shown in the drawing) that is to be made into the via conductor 7A and a green via conductor L7 that is to be made into a via conductor 7B are formed so as to provide a H type wiring-conductor-forming sheet (type H).

In this regard, when Sheet 2 is used in place of Sheet 4 and Sheet 3 is used in place of Sheet 5 without forming the composite green sheets of Sheet 4 and Sheet 5, as described above, type B and type E are produced as wiring-conductor-forming sheets. Meanwhile, as described in the first to third embodiments, the composite green sheet to be provided with the green inner pattern conductor L4 is not limited to the composite green sheets illustrated in FIG. 11, part (B).

FIG. 11, part (C) is a schematic diagram showing the third step (green sheet stacking step) of the method for manufacturing the ceramic multilayer substrate 100C. Each of the wiring-conductor-forming sheets of type A, type C, type D, type F, type G, and type H produced in the second step is stacked in the order shown in FIG. 11, part (C).

<Fourth Step>

Figure 12:
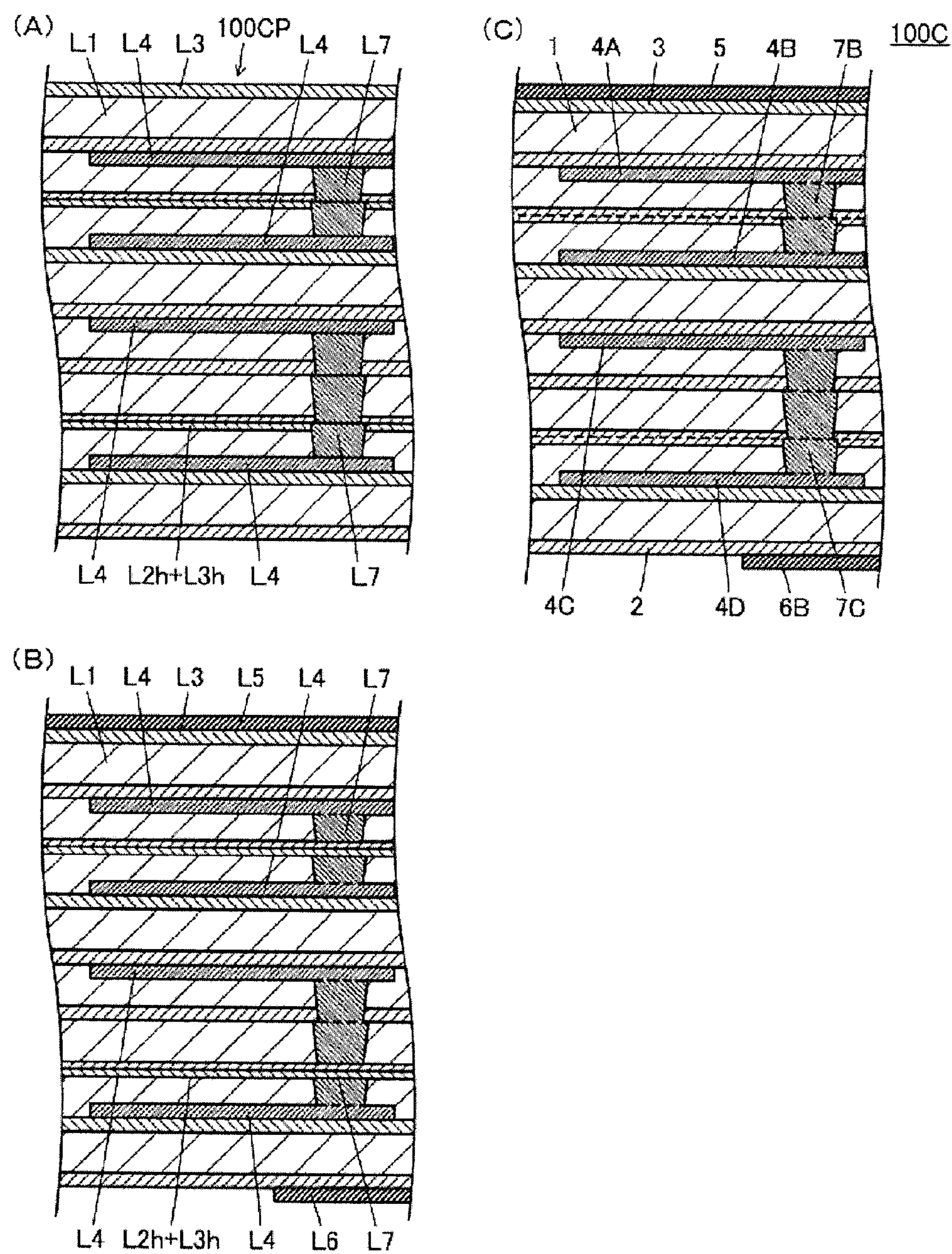
FIG. 12 is a schematic diagram illustrating an example of a method for manufacturing the ceramic multilayer substrate 100C and is a schematic diagram showing a fourth step (pressure bonding step) to a sixth step (firing step).

The fourth step (pressure bonding step, refer to FIG. 12, part (A)) is the same as the fourth step in the first embodiment. As a result, a pressure-bonded body 100CP is produced and, at that time, the green via conductor L7 disposed in each of the wiring-conductor-forming sheets is connected to each other, and the green inner pattern conductor L4 is connected to the green via conductor L7.

<Fifth Step>

FIG. 12, part (B) is a schematic diagram showing the fifth step (unsintered outer conductor formation step) of the method for manufacturing the ceramic multilayer substrate 100C. A green outer pattern conductor L5 and a green outer electrode L6 (not shown in the drawing) are formed on the upper surface and the lower surface, respectively, of the pressure-bonded body 100CP in the drawing so as to realize connections to the green via conductor L7 (not shown in the drawing) that is to be made into the via conductor 7A in the pressure-bonded body 100CP produced in the fourth step.

Meanwhile, a green outer electrode L6 is formed on the upper surface of the pressure-bonded body 100CP in the drawing at a location opposite to the green inner pattern conductor L4 with Sheet 1, which is arranged uppermost in the drawing, interposed therebetween. In addition, a green outer electrode L6 is formed on the lower surface (in the drawing) of the pressure-bonded body 100CP at a location opposite to the green inner pattern conductor L4 with Sheet 1, which is arranged lowermost in the drawing, interposed therebetween.

The above-described step is performed so as to co-fire the pressure-bonded body 100CP and the outer conductor. Alternatively, instead of co-firing the pressure-bonded body 100CP and the outer conductor, the outer conductor may be formed after the pressure-bonded body 100CP is fired, as in the first embodiment.

<Sixth Step>

The sixth step (pressure bonding step, refer to FIG. 12, part (C)) is the same as the sixth step in the first embodiment.

The ceramic multilayer substrate 100C according to the present invention can be efficiently produced by performing each of the above-described steps.

EXPERIMENTAL EXAMPLES

Next, the present invention will be described more specifically with reference to the experimental examples. These experimental examples also provide for grounds for specifying the thickness of the ceramic insulator layer and the ratio of the total of the thickness of the second layer and the thickness of the third layer to the thickness of the first layer in the ceramic multilayer substrate according to the present invention. In the experimental examples, the ceramic multilayer substrate shown in FIG. 1 was produced as a sample.

Experimental Example 1

Raw material powders such as $BaCO_3$, $SiO_2$, $Al_2O_3$, $ZrO_2$, and $MnCO_2$ were mixed so as to produce a mixed powder having a predetermined compositional ratio such that a celsian-type compound containing Ba, Si, and Al was formed after firing of the raw material powder, and the resulting mixed powder was made into a slurry by a known method so as to prepare a slurry for forming a first layer. In addition, raw material powders, $Al_2O_3$ and borosilicate glass, were mixed at a predetermined weight ratio, and the resulting mixed powder was made into a slurry in the same manner so as to prepare a slurry for forming a second layer and a third layer.

The slurries produced as described above were applied to the base-member film in a layered manner by a ceramic doctor blade method so as to produce each of green sheets such that the composite green sheet structures of Sheet 1 and Sheet 2 (refer to FIG. 2, part (A)) were achieved while the thickness after firing was adjusted to a predetermined thickness and attention was given to drying so as to avoid dissolution of the green first layer, the green second layer, and the green third layer with each other. At that time, the thickness, d1+d2+d3, of the ceramic insulator layer after firing was set to be constant. In example 1, the first layer, the second layer, and the third layer were included in the ceramic insulator layer. In comparative example 1, only the first layer was included, and in comparative example 2, the third layer was not included.

Table 1 shows aimed thickness after firing of each of the thickness d1 of the first layer, the thickness d2 of the second layer, the thickness d3 of the third layer, and the thickness, d1+d2+d3, of the ceramic insulator layer. When the green sheet was produced, the sintering shrinkage of a simple substance was determined in advance, and the green sheet was formed so as to have the thickness calculated in accordance with the sintering shrinkage. In this regard, as described below, it was ascertained that each of the thickness d1 of the first layer, the thickness d2 of the second layer, the thickness d3 of the third layer, and the thickness, d1+d2+d3, of the ceramic insulator layer in the ceramic multilayer substrate after firing was the same as the aimed thickness.

TABLE 1

| | First layer d1 (μm) | Second layer d2 (μm) | Third layer d3 (μm) | Ceramic insulator layer d1 + d2 + d3 (μm) |
|---|---|---|---|---|
| Example 1-1 | 5.0 | 2.5 | 2.5 | 10.0 |
| *Comparative example 1-1 | 10.0 | 0.0 | 0.0 | 10.0 |
| *Comparative example 1-2 | 7.5 | 2.5 | 0.0 | 10.0 |

*Data are out of the scope of the present invention.

Via holes were formed by laser machining or the like in each of the composite green sheets of Sheet 1 and Sheet 2 produced as described above. The resulting via holes were filled with a conductor paste containing Cu as a conductor component by screen printing so as to form green via conductors. In addition, the conductor paste containing Cu as a conductor component was applied to one principal surface of each of the composite green sheets of Sheet 1 and Sheet 2 by screen printing so as to form green inner pattern conductors having predetermined shapes. In this manner, the wiring-conductor-forming sheets of type A, type B, and type C (refer to FIG. 2, part (A)) were produced.

In this regard, the green inner pattern conductor and the green via conductor may be formed separately or at the same time. Also, the green inner pattern conductor and the green via conductor may be formed by known methods other than the screen printing.

The wiring-conductor-forming sheets of type A, type B, and type C produced as described above were stacked in the order shown in FIG. 2, part (C) and thermocompression-bonded under a predetermined condition so as to produce a pressure-bonded body. In this regard, the pressure-bonded body was produced as an assembly of green ceramic multilayer substrates.

A green outer pattern conductor and a green outer electrode were formed on the upper surface and the lower surface, respectively, of the pressure-bonded body so as to realize connections to the green via conductor that was to be made into the via conductor in the pressure-bonded body produced as described above. Also, a green outer electrode was formed on the lower surface of the pressure-bonded body so as to realize connections to the green via conductor that was to be made into the via conductor.

The pressure-bonded body which were produced as described above and which included the green outer conductor was fired under a predetermined condition, and a Ni plating film and an Au plating film were formed on the surface of each of the outer pattern conductor and the outer electrode after the firing so as to produce the ceramic multilayer substrate of each of example 1, comparative example 1, and comparative example 2.

The thickness of each of the first layer, the second layer, and the third layer of the three types of ceramic multilayer substrates produced as described above was measured. A method for measuring the thickness will be described with reference to FIG. 13.

Figure 13:
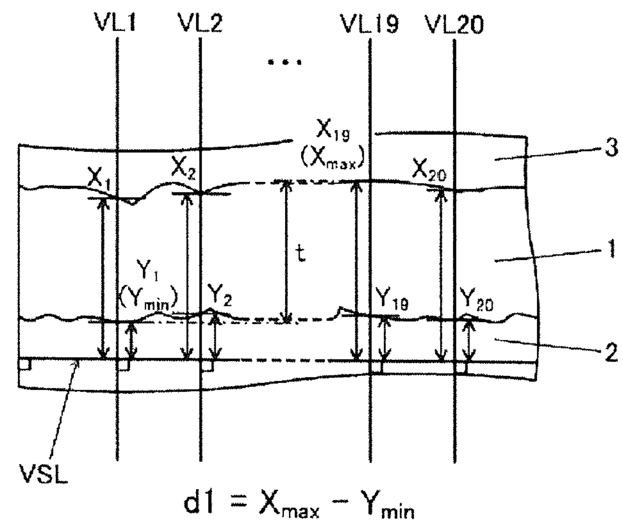
FIG. 13 is a schematic diagram showing a method for measuring the thickness d1 of a first layer 1 in the ceramic multilayer substrate 100.

FIG. 13 is a schematic diagram showing a method for measuring the thickness d1 of the first layer 1 in the ceramic multilayer substrate 100. In this regard, FIG. 13 shows the measurement of the thickness d1 of the first layer, and the thickness d2 of the second layer and the thickness d3 of the third layer may be measured by the same method.

Initially, a predetermined distance from the end surface of the ceramic multilayer substrate after the firing was polished in an inward direction such that a cross section of a region in which the outer pattern conductor did not cover the third layer was exposed. A cross section (observation surface) which was orthogonal to the cross section of the above-described region and at which the first layer to the third layer were exposed, was exposed by polishing. Subsequently, the observation surface was subjected to SEM observation, and randomly chosen several portions were photographed.

Regarding the resulting observation photograph, a straight line VSL orthogonal to the cross section obtained by initial polishing was drawn, in an inward direction of the ceramic multilayer substrate, from the end surface of the ceramic multilayer substrate after polishing the cross section. Then, 20 straight lines VL1 to VL20 orthogonal to the straight line VSL were drawn at intervals of 10 μm from the straight line VSL, and each of distances X1 to X20 from the straight line VSL to the intersection with the upper surface of a pattern main portion MP and each of distances Y1 to Y20 from the straight line VSL to the intersection with the lower surface of the pattern main portion MP were determined. Thereafter, the difference between a maximum value Xmax among the distances X1 to X20 and a minimum value Ymin among the distances Y1 to Y20 was taken as the thickness d1 of the first layer 1.

Subsequently, the insulation resistance between wiring conductors (in the present experimental example, between the inner pattern conductor and the outer pattern conductor) of each of the resulting three types of ceramic multilayer substrates was measured. Before the measurement of the insulation resistance, the ceramic multilayer substrate was passed through a reflow furnace, in which a maximum temperature was set at 260° C., three times and was left to stand for 192 hours in a pressure cooker at a temperature in the chamber of 121° C. and in a humidity in the chamber of 85% RH so as to accelerate reduction in insulation resistance. A method for measuring the insulation resistance will be described with reference to FIG. 14.

Figure 14:
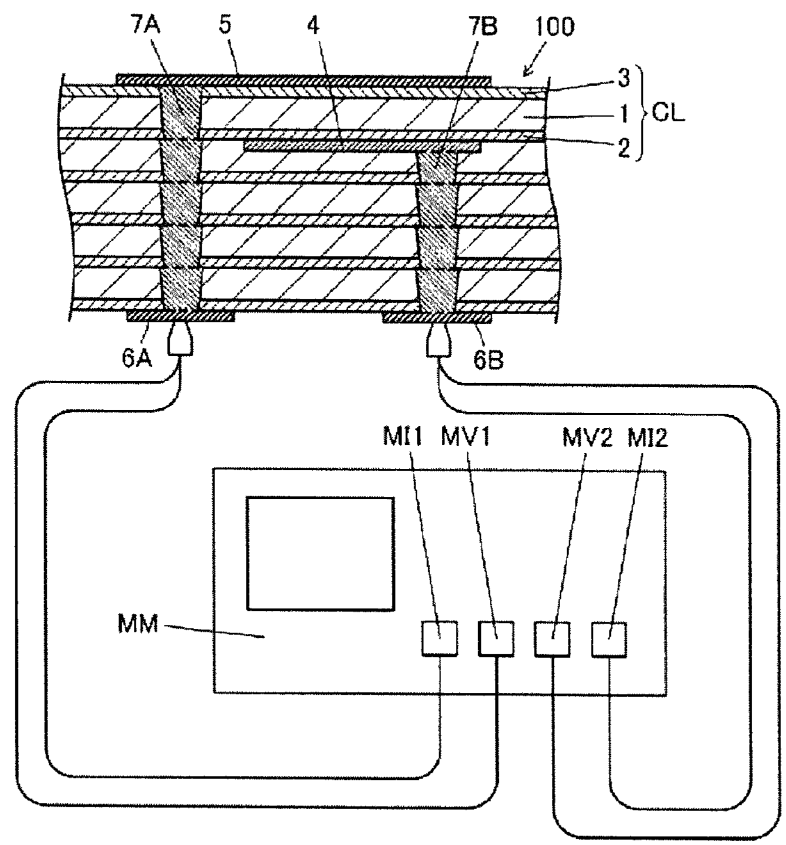
FIG. 14 is a schematic diagram showing a method for measuring the insulation resistance between an inner pattern conductor 4 and an outer pattern conductor 5 in the ceramic multilayer substrate 100.
Figure 15:
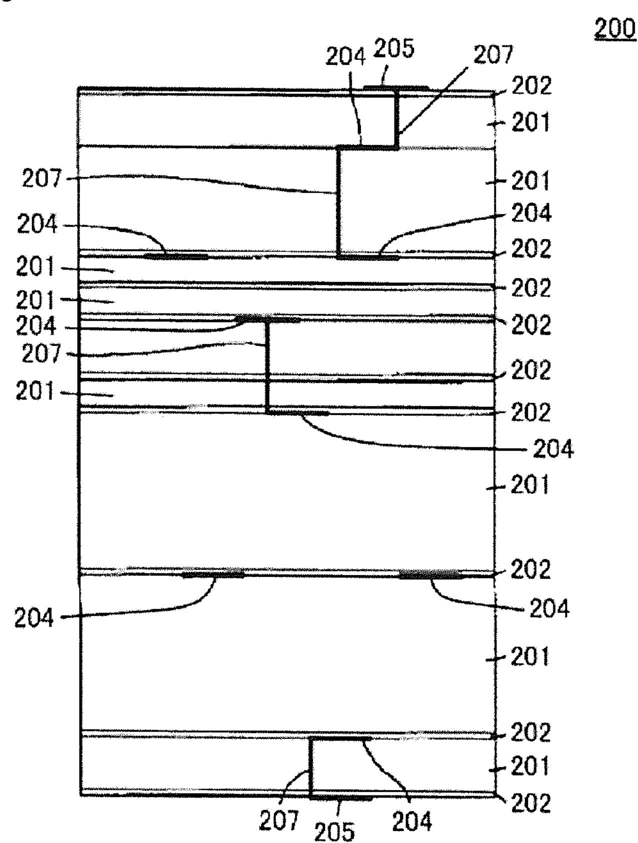
FIG. 15 is a sectional view of a ceramic multilayer substrate 200 in the related art.

FIG. 14 is a schematic diagram showing a method for measuring the insulation resistance between the inner pattern conductor 4 and the outer pattern conductor 5 in the ceramic multilayer substrate 100. The connection resistance value was measured by a direct-current four-probe method shown in FIG. 14. That is, probes connected to direct-current terminals MI1 and MI2 of a resistance measuring instrument MM and probes connected to direct-current voltage terminals MV1 and MV2 were brought into contact with outer electrodes 6A and outer electrodes 6B of the ceramic multilayer substrate such that a measurement circuit of the direct-current four-probe method was formed, and the insulation resistance between the inner pattern conductor 4 and the outer pattern conductor 5 was measured.

Then, a ceramic multilayer substrate showing an insulation resistance value of $10^9$ or more was assumed to be a good product and indicated by ○ in Table 2 described below, and a ceramic multilayer substrate showing an insulation resistance value of less than $10^9$ was assumed to be a defective product and indicated by x in Table 2.

TABLE 2

| | First layer d1 (μm) | Second layer d2 (μm) | Third layer d3 (μm) | Ceramic insulator layer d1 + d2 + d3 (μm) | Resistance value between wiring conductors |
|---|---|---|---|---|---|
| Example 1-1 | 5.0 | 2.5 | 2.5 | 10.0 | ○ |
| *Comparative example 1-1 | 10.0 | 0.0 | 0.0 | 10.0 | X |
| *Comparative example 1-2 | 7.5 | 2.5 | 0.0 | 10.0 | X |

*Data are out of the scope of the present invention.
Surface layer electrode resistance value ○: $10^9$ Ω or more, X: less than $10^9$ Ω

Measurement results shown in Table 2 indicate that high insulation resistance was obtained in example 1 in which the first layer, the second layer, and the third layer were included in the ceramic insulator layer. Meanwhile, it is clear that the insulation resistance was reduced in each of comparative example 1 in which only the first layer was included and comparative example 2 in which the third layer was not included.

Experimental Example 2

Ceramic multilayer substrates in which the thickness of each of the first layer, the second layer, and the third layer was variously changed as shown in Table 3 described below were produced in conformity with the manufacturing method shown in experimental example 1. Regarding these ceramic multilayer substrates, in the same manner as experimental example 1, the thickness of each of the first layer, the second layer, and the third layer was measured, and the insulation resistance between the inner pattern conductor and the outer pattern conductor was measured. Further, presence or absence of the occurrence of crack that occurred between the inner pattern conductor and the outer pattern conductor so as to realize connections therebetween (hereafter referred to as vertical crack) was observed.

Further, it is considered that a plating solution or moisture in an environment enters a vertical crack portion and, thereby, the insulation resistance between the inner pattern conductor and the outer pattern conductor is reduced.

In addition, it is considered that, when the above-described ratio is more than 1.11, sintering of the second layer and the third layer is significantly insufficient, a plating solution or moisture in an environment enters remaining pores, and the insulation resistance between the inner pattern conductor and the outer pattern conductor is thereby reduced.

TABLE 3

| | First layer d1 (μm) | Second layer d2 (μm) | Third layer d3 (μm) | Ceramic insulator layer d1 + d2 + d3 (μm) | Layer thickness ratio $\frac{(d2 + d3)}{d1}$ | Crack | Resistance value between wiring conductors |
|---|---|---|---|---|---|---|---|
| Example 2-1 | 4.0 | 0.5 | 0.5 | 5.0 | 0.25 | none | ○ |
| Example 2-2 | 7.0 | 1.0 | 1.0 | 9.0 | 0.29 | none | ○ |
| Example 2-3 | 7.5 | 2.5 | 2.5 | 12.5 | 0.67 | none | ○ |
| Example 2-4 | 9.0 | 2.5 | 2.5 | 14.0 | 0.56 | none | ○ |
| Example 2-5 | 16.0 | 3.2 | 3.2 | 22.4 | 0.40 | none | ○ |
| Example 2-6 | 16.0 | 2.7 | 3.7 | 22.4 | 0.40 | none | ○ |
| Example 2-7 | 11.0 | 3.0 | 3.0 | 17.0 | 0.55 | none | ○ |
| Example 2-8 | 11.0 | 2.5 | 3.5 | 17.0 | 0.55 | none | ○ |
| Example 2-9 | 12.0 | 4.0 | 4.0 | 20.0 | 0.67 | none | ○ |
| Example 2-10 | 16.0 | 4.0 | 4.0 | 24.0 | 0.50 | none | ○ |
| Example 2-11 | 20.0 | 4.0 | 4.0 | 28.0 | 0.40 | none | ○ |
| Example 2-12 | 26.5 | 4.0 | 4.0 | 34.5 | 0.30 | none | ○ |
| Example 2-13 | 16.0 | 4.8 | 4.8 | 25.6 | 0.60 | none | ○ |
| Example 2-14 | 44.3 | 5.7 | 5.7 | 55.7 | 0.26 | none | ○ |
| Example 2-15 | 9.0 | 5.0 | 5.0 | 19.0 | 1.11 | none | ○ |
| * Comparative example 2-1 | 2.0 | 0.5 | 0.5 | 3.0 | 0.50 | none | x |
| * Comparative example 2-2 | 68.6 | 5.7 | 5.7 | 80.0 | 0.17 | yes | x |
| * Comparative example 2-3 | 10.0 | 6.0 | 6.0 | 22.0 | 1.20 | none | x |

* Data are out of the scope of the present invention.
Surface layer electrode resistance value
○: $10^9$ Ω or more,
x: less than $10^9$ Ω

[Measurement results shown in Table 3 indicate that high insulation resistance was obtained when the thickness of the ceramic insulator layer was 5.0 μm or more and 55.7 μm or less and the ratio of the total of the thickness of the second layer 2 and the thickness of the third layer 3 to the thickness of the first layer 1 was 0.25 or more and 1.11 or less. Meanwhile, it is clear that the insulation resistance was reduced when the thickness of the ceramic insulator layer CL and the relationship represented by the ratio of the total of the thickness of the second layer 2 and the thickness of the third layer 3 to the thickness of the first layer 1 were out of the above-described range.

The reason for this is considered to be that, when the thickness of the ceramic insulator layer is less than 5.0 μm, the thickness of each of the first layer to the third layer is small, diffusion of the conductor component in the second layer and the third layer, which also serve as diffusion-suppressing layers, is not sufficiently suppressed, the conductor component diffuses into the first layer which serves as the base-member ceramic layer, and a substantial distance between the conductors is thereby further decreased.

Meanwhile, when the ratio of the total of the thickness of the second layer 2 and the thickness of the third layer 3 to the thickness of the first layer 1 is less than 0.25, suppression of sintering shrinkage of the first layer by the second layer and the third layer, which serve as constraining layers, is insufficient, and the above-described vertical crack occurs.

In this regard, the present invention is not limited to the above-described embodiments, and various applications and modifications can be made within the scope of the present invention. Also, it is indicated that each of the embodiments described in the present specification is an exemplification, and configurations of different embodiments can be partly replaced or combined with each other.

Incidentally, the entire contents of the embodiments disclosed above are exemplifications and not limitative. The scope of the present invention is represented by the claims and includes all modifications equivalent to the spirit and scope of the claims.

REFERENCE SIGNS LIST

100, 100A, 100B, 100C ceramic multilayer substrate, first layer, 2 second layer, 3 third layer, 4 inner pattern conductor, 5 outer pattern conductor, 6A, 6B outer electrode, 7A, 7B via conductor, CL ceramic insulator layer

The invention claimed is:

1. A ceramic multilayer substrate comprising:

a ceramic insulator layer which includes a first layer, a second layer, and a third layer and in which the first layer is interposed between the second layer and the third layer, and the third layer is an outermost layer of the ceramic multilayer substrate:

inner pattern conductors disposed inside the ceramic multilayer substrate; first outer conductors disposed on a first outer surface of the ceramic multilayer substrate;

second outer conductors disposed on a second outer surface of the ceramic multilayer substrate, the second outer surface is an opposite surface to the first outer surface, wherein the ceramic insulator layer is interposed at least one of (1) between a first Inner pattern conductor of the inner pattern conductors and a first outer conductor of the first outer conductors and (2) between a first inner pattern conductor and a second inner pattern conductor of the inner pattern conductors, the first inner pattern conductor is disposed on the second layer, a sintering shrinkage start temperatures of the second layer alone and the third layer alone in a green sheet state are higher than or equal to a sintering shrinkage stop temperature of the first layer alone in a green sheet state, a thickness of the ceramic insulator layer is 5.0 um to 55.7 um, a ratio of a total of a thickness of the second layer and a thickness of the third layer to a thickness of the first layer is 0.25 to 1.11, and the first outer conductors are connected to either of (1) one of the inner pattern conductors except for the first inner pattern conductor or (2) one of the second outer conductors with a via conductor; wherein the first layer is a ceramic layer containing a celsian-type compound containing Ba, Si, and Ai, and the second layer and the third layer are ceramic layers that are mixtures of $Al_2O_3$ or $ZrO_2$ and borosilicate.

2. The ceramic multilayer substrate according to claim 1, wherein die first outer conductor is one of an outer pattern conductor and an outer electrode.

3. The ceramic multilayer substrate according to claim 2, wherein the ceramic insulator layer is interposed at least one of (1) between the outer pattern conductor and the first inner pattern conductor and (2) between the first inner pattern conductor and the outer electrode.

4. The ceramic multilayer substrate according to claim 1, wherein the first outer conductor is one of an outer pattern conductor and an outer electrode.

5. The ceramic multilayer substrate according to claim 4, wherein the ceramic insulator layer is interposed at least one of (I) between the outer pattern conductor and the first inner pattern conductor and (2) between the first inner pattern conductor and the outer electrode.

6. The ceramic multilayer substrate according to claim 1, wherein the ceramic insulator layer is interposed between the first inner pattern, conductor and the first outer conductor, the first outer conductor is an outer pattern conductor, and the first outer conductors further include a first outer electrode and a second outer electrode.

7. The ceramic multilayer substrate according to claim 1, wherein the ceramic insulator layer is interposed between the first inner pattern conductor and the first outer conductor, the first outer conductor is a first outer electrode, and the first outer conductors further include an outer pattern conductor and a second outer electrode.

8. The ceramic multilayer substrate according to claim 1, wherein the ceramic insulator layer is interposed between the first inner pattern conductor and the second inner pattern conductor, the first outer conductor is an outer pattern conductor, and the first outer conductors further include a first outer electrode and a second outer electrode.

9. The ceramic multilayer substrate according to claim 1, wherein the ceramic insulator layer is a first ceramic insulator layer interposed between the first inner pattern conductor and the first outer conductor, the first outer conductor is an outer pattern conductor, the first outer conductors further include a first outer electrode and a second outer electrode, and the inner conductor patterns further include a third inner conductor pattern and a fourth inner conductor pattern, the ceramic multilayer substrate further comprising:

a second ceramic insulator layer interposed between the second inner pattern conductor and the third inner pattern, the second ceramic insulator layer including a fourth layer, a fifth layer, and a sixth layer and in which the fourth layer is interposed between the fifth layer and the sixth layer; and a third ceramic insulator layer interposed between, the fourth inner pattern conductor and the second outer electrode, the third ceramic insulator layer including a seventh layer, an eighth layer, and a ninth layer and in which the seventh layer is interposed between the eighth layer and the ninth layer.

10. The ceramic multilayer substrate according to claim 9, wherein a sintering shrinkage start temperatures of the fifth layer alone and the sixth layer alone in a green sheet state are higher than or equal to a sintering shrinkage stop temperature of the fourth layer alone in a green sheet state, a thickness of the second ceramic insulator layer is 5.0 μm to 55.7 μm, a ratio of a total of a thickness of the fifth layer and a thickness of the sixth layer to a thickness of the fourth layer is 0.25 to 1.11, a sintering shrinkage start temperatures of the eighth layer alone and the ninth layer alone in a green sheet state are higher than or equal to a sintering shrinkage stop temperature of the seventh layer alone in a green sheet state, a thickness of the third ceramic insulator layer is 5.0 μm to 55.7 μm, and a ratio of a total of a thickness of the eighth layer and a thickness of the ninth layer to a thickness of the seventh layer is 0.25 to 1.11.

11. The ceramic multilayer substrate according to claim 10, wherein the first layer, fourth layer and seventh layer are ceramic layers containing a celsian-type compound containing Ba, Si, and Al, and the second layer, third layer, fifth layer, sixth layer, eighth layer and ninth layer are ceramic layers that are mixtures of $Al_2O_3$ or $ZrO_2$ and borosilicate glass.

12. The ceramic multilayer substrate according to claim 9, wherein the first layer, fourth layer and seventh layer are ceramic layers containing a celsian-type compound containing Ba, Si, and Al, and the second layer, third layer, fifth layer, sixth layer, eighth layer and ninth layer are ceramic layers that are mixtures of $Al_2O_3$ or $ZrO_2$ and borosilicate glass.

* * * * *